United States Patent
Eisenberg et al.

(10) Patent No.: US 6,452,446 B1
(45) Date of Patent: Sep. 17, 2002

(54) CLOSED LOOP ACTIVE CANCELLATION TECHNIQUE (ACT)-BASED RF POWER AMPLIFIER LINEARIZATION ARCHITECTURE

(75) Inventors: John Eisenberg, Los Altos; Steve Avis, Pleasanton, both of CA (US)

(73) Assignee: Spectrian Corporation, Sunnyvale, CA (US)

( * ) Notice: Subject to any disclaimer, the term of this patent is extended or adjusted under 35 U.S.C. 154(b) by 0 days.

(21) Appl. No.: 10/034,016

(22) Filed: Dec. 20, 2001

Related U.S. Application Data
(60) Provisional application No. 60/259,012, filed on Dec. 29, 2000.

(51) Int. Cl.[7] .............................. H03F 3/66; H03F 1/26; H03F 1/00
(52) U.S. Cl. .......................... 330/52; 330/149; 330/151
(58) Field of Search ............................ 330/52, 149, 151

(56) References Cited

U.S. PATENT DOCUMENTS

| | | | | |
|---|---|---|---|---|
| 5,386,198 A | * | 1/1995 | Ripstrand et al. ............ | 330/149 |
| 6,066,984 A | * | 5/2000 | Tomaru et al. .............. | 330/126 |
| 6,104,241 A | | 8/2000 | Cova et al. .................. | 330/149 |
| 6,111,462 A | | 8/2000 | Mucenieks et al. ......... | 330/149 |
| 6,208,207 B1 | * | 3/2001 | Cavers ........................ | 330/149 |

* cited by examiner

Primary Examiner—Patricia Nguyen
(74) Attorney, Agent, or Firm—Allen, Dyer, Doppelt, Milbrath & Gilchrist, P.A.

(57) ABSTRACT

A closed loop, active cancellation technique (ACT)-based RF power amplifier linearization architecture injects a pilot tone as a 'pseudo distortion' signal into signal paths through first and second matched RF amplifiers, and a set of power minimization loops are closed around the RF amplifier pair. The power minimizing control loops control a set of vector modulators such that both the injected pilot tone and intermodulation distortion products are canceled, while RF carrier components constructively sum in the composite output of the two RF amplifiers.

20 Claims, 4 Drawing Sheets

CLOSED LOOP ACTIVE CANCELLATION TECHNIQUE (ACT)-BASED RF POWER AMPLIFIER LINEARIZATION ARCHITECTURE

CROSS-REFERENCE TO RELATED APPLICATION

The present application claims the benefit of copending U.S. Provisional Patent Application, Serial No. 60/259,012, filed Dec. 29, 2000, by S. Avis et al, entitled: "Improved ACT Pre-Distortion Linearized Power Amplifier," assigned to the assignee of the present application and the disclosure of which is incorporated herein.

FIELD OF THE INVENTION

The present invention relates in general to communication systems, and is particularly directed to a new and improved, closed loop, Active Cancellation Technique (ACT)-based RF power amplifier linearization architecture having parallel RF amplifiers coupled in intermod-complementing predistortion paths of the type disclosed in the U.S. Patent to Mucinieks, U.S. Pat. No. 6,111,462, (hereinafter referred to as the '462 patent and the disclosure of which is incorporated herein). By injecting a pilot tone into the signal transport paths of each of the RF power amplifiers, the invention is able to close a set of vector modulation control loops and thereby track and cancel intermodulation distortion products from the composite output of the pair of RF amplifiers.

BACKGROUND OF THE INVENTION

Communication service providers are subject to very strict bandwidth usage spectrum constraints, including technically mandated specifications and regulations imposed by the Federal Communications Commission (FCC). These rules require that sideband spillage, namely the amount of energy spillover outside a licensed band of interest, be sharply attenuated (e.g., on the order of 50 dB). Although these regulations may be easily met for traditional forms of modulation, such as FM, they are difficult to achieve using more contemporary, digitally based modulation formats, such as M-ary modulation.

Attenuating the sidebands sufficiently to meet industry and regulatory-based requirements by such modulation techniques requires very linear signal processing systems and components. Although linear components can be produced at a reasonable cost at the relatively narrow bandwidths (baseband) of telephone networks, linearizing inherently non-linear components such as RF power amplifiers can be prohibitively expensive.

A fundamental difficulty in linearizing RF power amplifiers is the fact that they generate unwanted intermodulation distortion products (IMDs) which manifest themselves as spurious signals in the amplified RF output signal, such as spectral regrowth or spreading of a compact spectrum into spectral regions that do not appear in the RF input signal. This distortion causes the phase/amplitude of the amplified output signal to depart from the phase/amplitude of the input signal, and may be considered as an incidental (and undesired) amplifier-sourced modulation of the RF input signal.

A brute force and relatively inefficient approach to linearize an RF power amplifier is to build the RF amplifier as a large, high power device, and then operate the amplifier at a very low power level (namely, at only a small percentage of its rated output power), where the RF amplifier's transfer characteristic is substantially linear. An obvious drawback to this approach is the overkill penalty—a costly, inefficient and large sized RF device.

Other prior art linearization techniques include baseband polar (or Cartesian) feedback, post-amplification, feed-forward correction, and pre-amplification, pre-distortion correction. In the first approach, the output of the RF power amplifier is compared to the input, and a baseband error signal is used to directly modulate the signal which enters the amplifier. In the second approach, error (distortion) present in the RF amplifier's output signal is extracted, amplified to the proper level, and then reinjected (as a complement of the error signal back) into the output path of the amplifier, so that (ideally) the RF amplifier's distortion is effectively canceled.

Pursuant to a third approach, a predistortion signal is injected into the RF input signal path upstream of the RF amplifier. Ideally, the predistortion signal has a characteristic equal and opposite to the distortion expected at the output of the RF amplifier. As a result, when subjected to the (distorting) transfer characteristic of the RF amplifier, it effectively cancels the distortion in the output. Predistortion may be made adaptive by measuring the distortion at the output of the RF amplifier and adjusting the predistortion control signal to minimize the distortion of the output signal of the power amplifier during real time operation.

In accordance with the 'Active Cancellation Technique' (ACT) RF power amplifier linearization scheme described in the '462 Patent, and shown diagrammatically in FIG. 1, high efficiency RF power amplifier linearization is achieved by an open loop technique that adjusts signal components driving a pair of effectively 'matched' RF power amplifiers $A_1$ and $A_2$, such that one RF power amplifier 'pre-distorts' the other. Being matched implies that the two amplifiers $A_1$, $A_2$ have essentially the same transfer characteristics—both in terms of their intended RF performance and unwanted IMD components they inherently introduce into their amplified outputs.

More particularly, an RF input signal to be amplified is split by a directional coupler CPL1 into two paths. A first path includes an attenuator or scaling pad ATT and a controlled gain adjustment G1 and a phase adjustment element Φ1, which adjust the amplitude and phase of the RF input signal prior to being amplified by the main amplifier $A_1$. The output of the main path amplifier $A_1$ is coupled through a delay stage DL2 to a first input of an output combining stage OCS (such as a quadrature hybrid).

A second split RF input signal path is used to derive a signal containing both the original RF input signal to be amplified by the second 'matched' amplifier $A_2$, and a complementary version of the IMD products which each of the two amplifiers inherently introduces. IMD products are extracted using carrier cancellation circuitry WS1-WC1 similar to that found in most conventional feed-forward RF power amplifiers. The extracted distortion products are adjusted in amplitude and phase by gain and phase control elements G1 and Φ1 and combined with an appropriately delayed and scaled sample of the RF input signal at WC2.

For this purpose, the second path from the directional coupler CPL1 is coupled through a delay stage DL1 to a first input of (Wilkinson) splitter WS1, a first output of which is coupled to (Wilkinson) combiner WC1. A second output of splitter WS1 is coupled through a variable gain stage G2 to a first input of further (Wilkinson) combiner WC2, a second input of which is coupled to the output of the combiner WC1. A second input of combiner WC1 is coupled to a directional coupler CPL2 installed in the output path of main path amplifier $A_1$.

The output of combiner WC2, which is a composite of the RF input signal and complementary distortion products extracted from the RF amplifier $A_1$, is coupled through a variable gain stage G3 and variable phase adjustor $\Phi 2$ to the matched RF amplifier $A_2$. The output of RF amplifier $A_2$ is coupled to a second input of output combining stage OCS.

The amplitude of the RF input signal component of the composite RF signal driving the amplifier $A_2$ is adjusted to be the same as the amplitude of the pure RF input signal driving amplifier $A_1$. Namely, the phase and amplitude of the distortion products are adjusted so that they not only cancel the distortion products generated by the input signals applied to the error amplifier $A_2$, but also replace these distortion products with equal amplitude anti-phase replicas of these products. Thus, the delayed output of amplifier $A_1$ and the undelayed output of the amplifier $A_2$ contain equal phase and amplitude amplified RF input signals and equal amplitude anti-phase distortion products. Thus, distortion components resulting from the RF input signal components driving both amplifiers are essentially the same.

In the output combining stage OCS, these signals are summed, so that (desired) amplified RF (carrier) signals add and (unwanted) distortion products cancel. The output from the combining stage OCS is therefore an amplified version of the RF input signal, that is substantially free of distortion, even though both amplifiers contain distortion products at their outputs. Both amplifiers contribute essentially equal amounts of amplification power to the output of the overall system. Operating efficiency is better than that of a conventional feed forward amplifier because essentially the entirety of both amplifiers' output power appears at the output of the combining stage.

It should be noted that the ACT architecture of FIG. 1 is not a classic feed-forward architecture. Rather, it is a very effective type of dual amplifier-based, RF pre-distortion amplifier structure, in which the source of the energy used to pre-distort the matched amplifier $A_2$ is produced by an identical (main) amplifier $A_1$, driven by essentially the same input signals as its matched counterpart. The level of distortion components in the energy driving the matched amplifier $A_2$ is on the order of 30 dB below the RF input signal component. Thus, the dynamics of both amplifiers is controlled by the dominant input signal energy.

Now although the ACT amplifier-based linearization scheme described in the '462 Patent is very effective for achieving a level of non-linear distortion correction at least on the order of 20 dB and greater, a given production device may not be capable of maintaining this level of performance over a wide range of ambient temperature and varying power supply voltage.

One of the reasons for this potential performance shortcoming of the linearization scheme of the '462 patent is the fact that it is an open loop architecture, and operates on the assumption that since the attenuators which adjust the power to the 'matched' main and power amplifiers are slaved together, it can be reasonably inferred that the resulting output signal and distortion energy delivered by each amplifier will be exactly the same. However, investigation by the present inventors on substantial numbers of practical production power amplifiers linearized in accordance with the '462 Patent approach has shown this not to be the case.

SUMMARY OF THE INVENTION

Pursuant to a first embodiment of the invention, this amplifier output signal and distortion energy inequality problem is effectively remedied by injecting pilot tone as a 'pseudo distortion' signal into the signal transport paths of each of the pair of RF power amplifiers, in order to track intermodulation distortion products produced by each amplifier. Prescribed signal transport paths of the dual amplifier architecture are monitored by a set of minimization control loops, which control associated vector modulators, such that both the injected pilot tones and intermodulation distortion products are canceled, while RF carrier components are mutually reinforced or constructively sum in the composite output of the pair of RF amplifiers.

To this end, the signal flow path to one of the two 'matched' RF amplifiers includes a first vector modulator, which is controlled by a first digital signal processor-executed carrier power control mechanism. This first carrier power control mechanism monitors carrier power measured by a detector at the output of the carrier cancellation loop, and adjusts the operation of the first vector modulator, so as to effectively minimize carrier energy, leaving only an injected pilot tone and amplifier distortion energy at the output of the carrier cancellation loop.

A relatively low level, out-of-band pilot tone, which serves as a 'pseudo distortion' signal, is injected into the signal transport paths of the RF amplifiers, and is used to track and cancel intermodulation distortion products produced by each amplifier. The amplifier outputs thus contain a pilot tone component in addition to the desired RF signal and undesired IMDs. Since neither IMDs nor the pilot tone are part of the desired modulated carrier signal being amplified, they constitute unwanted distortion. The use of the pilot tone as a 'pseudo distortion' signal allows the pilot to be treated as representative of whatever noise or distortion is produced by the amplifier pair. By minimizing the contribution of the pilot tone to the composite output signal produced by the amplifier pair, IMDs are also minimized.

A further vector modulator is also installed in the first signal transport path feeding the second amplifier, and is controlled in accordance with a monitored pilot tone-based control loop, so that the injected pilot tone (and therefore any intermodulation distortion products) cancel, at the composite output of the two RF amplifiers.

A second vector modulator is further installed in the second signal transport path feeding the second amplifier, and is controlled in accordance with a power detector coupled to a terminated port of an output combiner. When the desired RF carrier components at the terminated port of the output combiner null, the carrier power levels at first and second input ports of the output combiner are essentially equal and sum constructively at the output signal port of the combiner.

The second vector modulator adjusts a component of input RF carrier energy so as to ensure that the RF carrier energy applied to the second amplifier is the same as that applied to the one amplifier. For this purpose, the output of the power detector monitoring the terminated output of the output combiner is applied to a second carrier power minimization-based control mechanism within the digital signal processor. This second carrier power control mechanism controls the second vector modulator so as to minimize any carrier leakage energy at the output combiner's terminated port, and thereby equalize the carrier inputs to the two amplifiers.

The amplitude and phase of the pilot energy injected into the second amplifier is adjusted by a gain/phase adjustor, so that when distortion is minimized at the output of the composite amplifier, the pilot energy is also minimized. The vector modulator installed in the first signal transport path is controlled so as to minimize both pilot energy and distortion at the signal output port of the output combiner. This ensures that the total contribution of the pilot tone component from the output of the first amplifier is exactly the opposite of the pilot tone component in the output of the second amplifier.

In accordance with a second embodiment, a feed-forward loop is wrapped around the closed loop, pre-distortion architecture of the first embodiment. The addition of the feed forward stage enables the integrated amplifier architecture containing the RF amplifier linearization stage and the feed forward stage to deliver extremely high linearity, including the ability to routinely achieve carrier-to-distortion ratios as high as 85 dB. Efficiency is significantly better than that which is typically seen in competitive dual loop feed forward power amplifiers.

DETAILED DESCRIPTION

Figure 1:
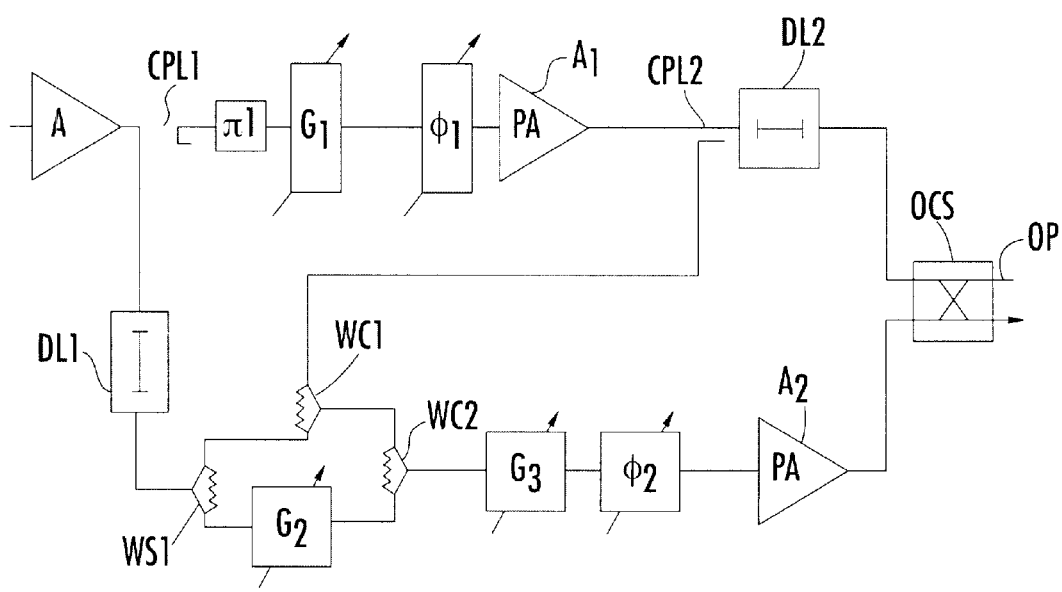
FIG. 1 diagrammatically illustrates an ACT-stage based RF power amplifier linearization architecture of the type disclosed in the above-referenced '462 Patent.

Before detailing the closed loop ACT stage-based RF power amplifier linearization architecture of the present invention, it should be observed that the invention resides primarily in an arrangement of conventional RF communication circuits and associated digital signal processing components and attendant supervisory control circuitry, that controls the operations of such circuits and components. Consequently, the configuration of these circuits and components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein.

Thus, the block diagram illustrations are primarily intended to show its major components in a convenient functional grouping, whereby the present invention may be more readily understood. In addition, to facilitate an understanding of signal processing flow through the respective paths of the linearization system of the various embodiments of the invention, reduced complexity spectral diagrams of the desired modulated RF carrier and the unwanted IMD components have been placed throughout the Figures in association with respective transfer functions of the system components.

Figure 2:
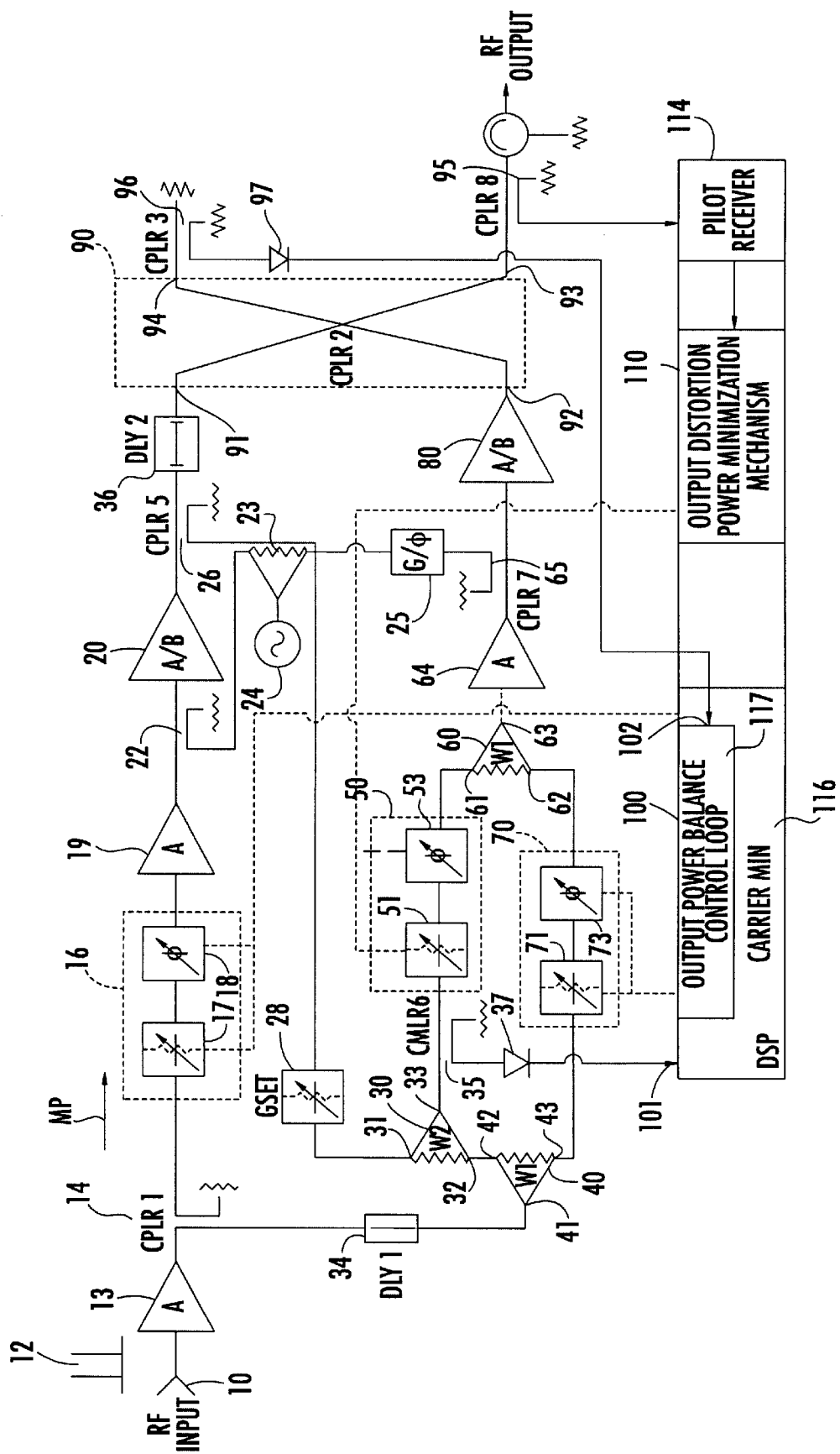
FIG. 2 diagrammatically illustrates a closed loop ACT stage-based RF power amplifier linearization mechanism in accordance with a first embodiment of the present invention.

Referring now to FIG. 2, a first embodiment of a closed loop ACT stage-based RF power amplifier linearization mechanism of the present invention is diagrammatically illustrated as comprising an input terminal 10 to which an RF input signal $RF_{IN}$ (such as a multicarrier RF signal pictorially represented by a carrier frequency pair 12) is applied. The RF input terminal 10 is coupled through a preamplifier 13 to a directional coupler (CPLR 1) 14 installed in a main signal flow path (designated by arrow MP) of a first, main RF amplifier 20.

The main signal flow path MP contains a first vector modulator 16 cascaded with a buffer amplifier 19 feeding the main RF amplifier 20. As a non-limiting example, the vector modulator unit 16 may be implemented as a variable gain (attenuator) stage 17 series coupled with a variable phase shifting stage 18. The variable gain stage 17 and phase shifting stage 18 are controlled by control signals supplied over a control link 15 from a first carrier power control mechanism 116 executed within a digital signal processor (DSP) 100.

As will be described, via an input 101, this first carrier power control mechanism 116 monitors the output of a power detector 37, which is coupled to a directional coupler 35 in the output path of a (pilot tone and distortion signal extracting) carrier cancellation (Wilkinson) combiner 30 of a carrier cancellation loop (loop 1). The carrier power control mechanism 116 executes a standard error minimization (e.g., power or least mean squared minimization), and adjusts the vector modulator 16 input to the RF amplifier 20, so that its contribution at the first input 31 of the carrier cancellation combiner 30 is the same amplitude and opposite phase as that of the RF carrier at the second input of the combiner 30. This effectively minimizes carrier energy, leaving only an injected pilot tone (injected via a directional coupler 22 at the input of amplifier 20) and amplifier distortion energy at the carrier cancellation combiner output 33.

The directional coupler 22 in the input path MP to main RF power amplifier 20 is coupled to one output of a (Wilkinson) splitter 23, which is coupled to receive a first, relatively low level, out-of-band pilot tone generated by a pilot tone generator 24. This low level pilot tone is injected into the signal transport paths of each of the RF power amplifier 20 and a matched companion RF power amplifier 80, and is used to track and cancel intermodulation distortion products produced by each amplifier. The vector modulator 25 is used to adjust the amplitude and phase of pilot energy incident upon the RF power amplifier 80, so that when vector modulator 50 is adjusted for optimum distortion cancellation at an output 93 of an output combiner 90, the pilot energy is simultaneously nulled at output 93 as well.

Because the pilot tone is injected immediately upstream of each RF amplifier 20/80, each amplifier output will contain a pilot tone component in addition to the desired RF signal and undesired IMDs. Since neither IMDs nor the pilot tone are part of the desired modulated carrier signal being amplified, they constitute unwanted distortion. The use of the pilot tone as a 'pseudo noise' signal allows the pilot to be treated as representative of whatever noise or distortion is produced by the amplifier pair. Therefore, by minimizing the contribution of the pilot tone to the composite output signal produced by the amplifier pair, IMDs are also minimized. As pointed out above, the distortion minimization scheme of the invention controls vector modulators for signal paths feeding the matched amplifier 80 by a pair of control loops, one monitoring pilot energy at the output of the composite ACT amplifier, and the other acting to equalize the desired carrier power at the outputs of the RF power amplifiers 20 and 80, so that the two injected pilot tones (and therefore any intermodulation distortion products) cancel, while the desired RF carrier components constructively sum in the composite output of RF amplifiers 20/80.

A second output of splitter 23 is applied to an amplitude/phase adjustor 25, which sets the amplitude of the pilot tone and adjusts its phase, for application via a directional coupler 65 to the input signal path to RF amplifier 80. The amplitude adjustment is set such that the pilot signal produced at the output of amplifier 80 and applied to an input 92 of an output combiner 90, shown configured as a four port combiner hybrid, will have exactly the same amplitude as the pilot signal produced at the output of amplifier 20 and applied to input 91 of output combiner 90. Since these two injected pilot signals are mutually antiphase (owing to the proper phase adjustment imparted by amplitude/phase adjustor 25), for equal amplitude pilot components at the output of each amplifier, the two pilots subtract from one another and are canceled at an output 93 of output combiner 90.

Because the input path to amplifier 80 also includes a component of the pilot tone that has been injected into the other amplifier 20 and extracted via the carrier cancellation combiner 30, the combiner's output port 93 is monitored via a directional coupler 95 feeding an input port 103 of a pilot tone receiver, which is coupled to an energy minimization mechanism 110 in the DSP 100. The pilot energy minimization mechanism controls the vector modulator 50, so as to minimize (drive to zero) any pilot tone energy at the output combiner's output port 93. This serves to ensure that the total contribution of the pilot tone component from the output of amplifier 20 (including the direct component applied to combiner input 91 and carrier cancellation component applied to combiner input 92) is exactly the opposite of the pilot tone component injected via the directional coupler 65 and amplified by amplifier 80 and applied to the combiner input 92.

For carrier cancellation, a portion of the amplified output signal from the main path RF power amplifier 20 is extracted via a further directional coupler 26 and coupled through an (output-scaling) attenuator pad 28 to input port 31 of the carrier cancellation combiner 30. The second input port 32 of combiner 30 is coupled to a first output 42 of a (Wilkinson) splitter 40. Wilkinson splitter 40 has its input 41 coupled through a delay line 34 in a signal flow path from directional coupler 14. The delay imparted by the delay line 34 corresponds to the delay in the main signal path MP through the power amplifier 20, thereby providing time alignment between the signals applied to carrier cancellation combiner 30.

The carrier components at inputs 31 and 32 of the carrier cancellation combiner 30 are adjusted by the vector modulator to be of equal carrier amplitude and anti-phase, so that carrier cancellation occurs at output 33. By subtracting a scaled version of the amplified output from the main path amplifier 20 from the RF input signal RFIN delayed through the first delay line 34, the carrier cancellation combiner 30 provides an output (absent carrier energy) representative of an estimate of the residual distortion produced by the main power amplifier 20 (which includes the 'pseudo distortion' pilot tone produced by the pilot tone generator 24 and injected by directional coupler 22.

Carrier cancellation combiner 30 has its output 33 coupled through a directional coupler 35 to the vector modulator 50 installed in a distortion energy transport path feeding a first input 61 of a distortion and carrier energy combiner 60. As noted earlier, the output of the directional coupler 35 is detected by power detector 37 and represents the residual carrier energy left over after carrier cancellation in combiner 30. The carrier power control mechanism 116 minimizes detected carrier energy, by adjusting the vector modulator 16 input to the RF amplifier 20, so that its contribution at the first input 31 of the carrier cancellation combiner 30 is the same as that of the RF carrier at the second input of the combiner 30. This leaves only the pilot tone injected at the input of RF amplifier 20 and amplifier distortion energy at the carrier cancellation combiner output 33.

Wilkinson splitter 40 has a second output 43 coupled to a variable gain stage 71 and variable phase shifter 73 of a vector modulator 70 installed in an input path to a second input 62 of the pilot/distortion and carrier energy combiner 60. Vector modulator 70 is operative to control the RF carrier energy therethrough so as to ensure that the RF carrier energy output from amplifier 80 is the same as that delivered by RF amplifier 20. For this purpose, the residual power at port 94 of output combiner 90 is monitored by power detector 97 which is coupled to input port 102 of DSP 100. The output of power detector 97 is applied to a second carrier power minimization-based control mechanism 117 within the DSP 100. This second carrier power control mechanism controls the vector modulator 70, so as to minimize (drive to zero) any carrier leakage energy at the output combiner's terminated port 94, and thereby maximizing the carrier power delivered at port 93 of the output combiner 90.

The output 63 of the distortion and carrier energy combiner 60 is coupled through a buffer amplifier 64 and antiphase pilot tone-injecting directional coupler 65 to RF amplifier 80. Thus, the input to the RF amplifier 80 includes three components. A first is RF carrier energy extracted from the RF input 10 via splitter 40 and adjusted by the vector modulator 70 to match the RF carrier energy applied to the companion RF amplifier 20. A second contains two distortion energy components—antiphase pilot tone and IMDs—which, when amplified by the RF amplifier 80, will exactly oppositely match the pilot and IMD components produced at the output of RF amplifier 20.

As in the open loop architecture of FIG. 1, the output combiner 90 of the multi vector modulator controlling, closed loop architecture of FIG. 2 produces a summation of the signals applied to its inputs 91 and 92, so that what is produced at output port 93 is a composite RF signal, in which the desired amplified RF carrier signals outputs produced by the two RF amplifiers 20 and 80 sum or constructively combine, and unwanted distortion products (including the injected pilot tones) destructively combine, or cancel.

Figure 3A:
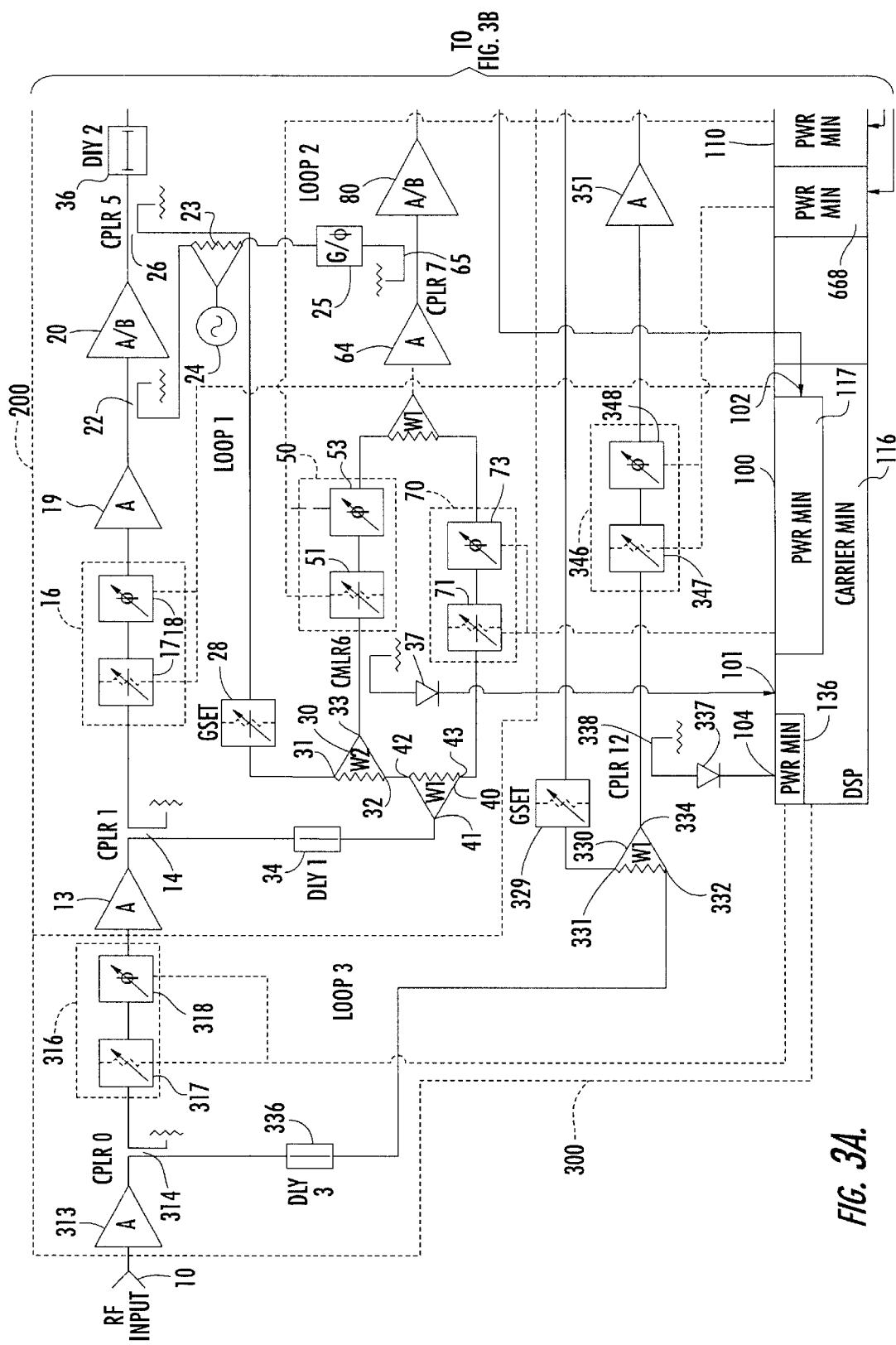
FIG. 3 diagrammatically illustrates a second embodiment of the present invention in which a feed forward loop is wrapped around the enhanced ACT-based RF power amplifier linearization architecture of FIG. 2.
Figure 3B:
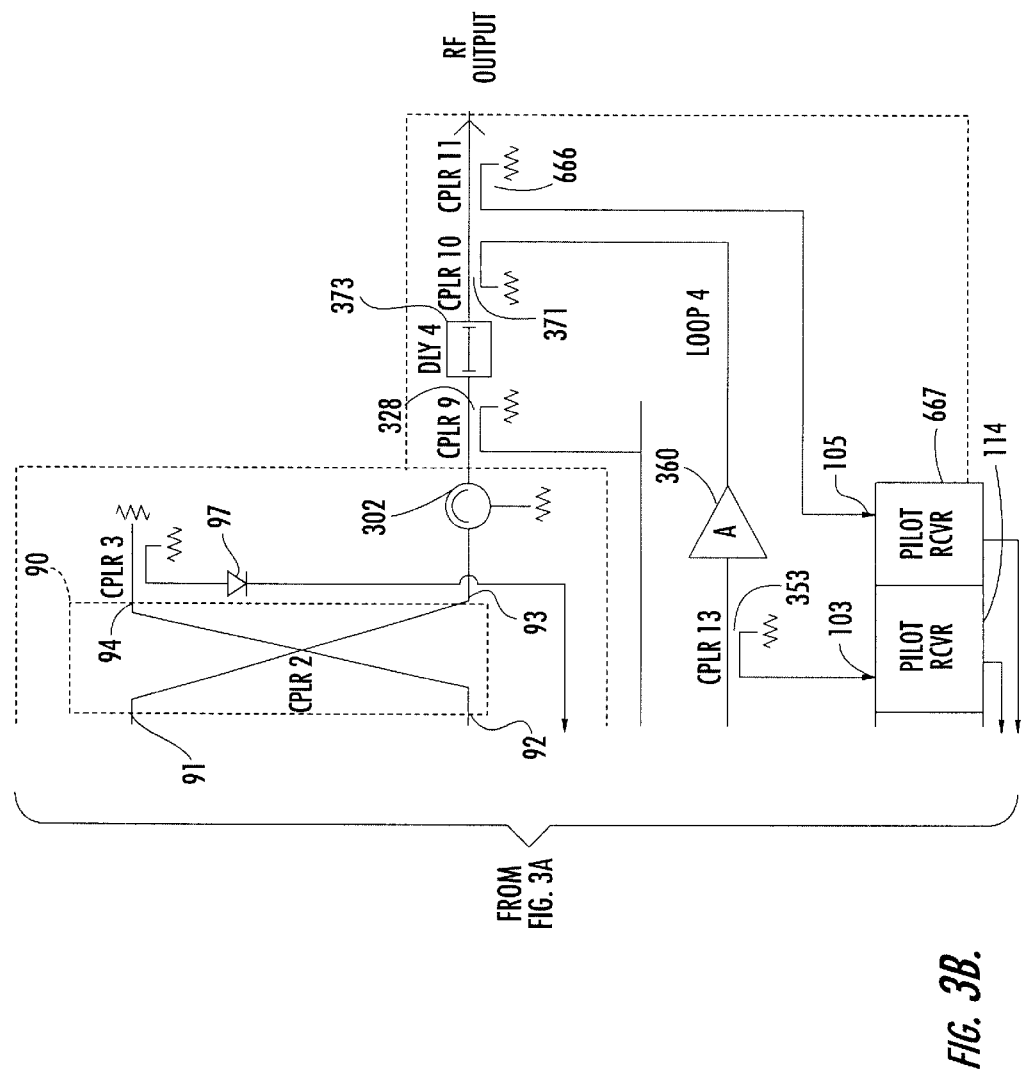

FIG. 3 diagrammatically illustrates a second embodiment of the invention, having feed forward loops shown in broken lines 300, that are 'wrapped around' the closed loop ACT-based RF power amplifier linearization architecture of FIG. 2, described above, and shown in broken lines as ACT RF amplifier linearization stage 200. The addition of the feed forward loops 300 enables the integrated amplifier architecture (containing the RF amplifier linearization stage 200 and the feed forward loops 300) to deliver extremely high linearity, including the ability to routinely achieve carrier-to distortion ratios as high as 85 dB. Efficiency is significantly better than that which is typically seen in competitive dual loop feed forward power amplifiers.

For this purpose, the 'wrapped around' feed forward loops 300 of the embodiment of FIG. 3 include a buffer amplifier 313 and a further directional coupler 314 coupled between the RF input terminal 10 and the main signal flow path of the ACT RF amplifier linearization stage 200. A first main path through the directional coupler 314 is coupled to a vector modulator 316, having a processor-controlled variable gain (attenuator) stage 317 and a processor-controlled variable phase shifting stage 318 cascaded with variable gain stage 317.

The output port 93 of the output combiner 90 of the amplifier linearization stage 200 is coupled through a circulator 302 to a directional coupler 328, used to extract a portion of the amplified output signal from the output combiner's output port 93. This extracted output signal is coupled through an (output-scaling) attenuator pad 329 to a first input 331 of a carrier cancellation (Wilkinson) combiner 330 within a further carrier cancellation loop (loop 3). A second input 332 of the carrier cancellation combiner 330 is coupled to a first delay line 336 installed in a second signal flow path from the directional coupler 314. The delay imparted by the delay line 336 corresponds to the delay in the signal path through the amplifier stage 200, and serves to time-align the two signals applied to the carrier cancellation combiner 330. By subtracting a scaled and antiphase version of the output of amplifier stage 200 from the RF input signal delayed through the first delay line 336, the carrier cancellation combiner 330 provides a 'further refined' estimate of the residual distortion produced by the ACT RF amplifier linearization stage 200.

Carrier rejection within the feed forward stage 300 is optimized by carrier power minimization mechanism 136 within DSP 100, which is coupled via a DSP input port 104 to a power detector 337, coupled to a directional coupler 338 at the output of the carrier cancellation combiner 330. The carrier power minimization mechanism 136 executes a detected power minimization algorithm, and outputs signals for controlling the attenuator 317 and the phase shifter 318 of the vector modulator 316 in the RF input path of the amplifier stage 200, so as to set the input RF carrier energy at a value that will cause the RF carrier power in the composite output signal at combiner output port 93, when scaled by attenuator 329, to cancel the RF input energy applied to the second input 332 of carrier cancellation combiner 330.

The distortion energy-representative output 333 of carrier cancellation combiner 330 is coupled to a vector modulator 346 of a feed-forward distortion cancellation loop (loop 4). Like the vector modulator 316, vector modulator 346 contains a processor-controlled variable gain stage 347 cascaded with a processor-controlled variable phase shifting stage 348.

The output of the vector modulator 346 is coupled through a buffer amplifier 351 and a directional coupler 353 to a feed-forward error amplifier 360 of loop 4. The feed-forward error amplifier 360 amplifies the gain and phased adjusted residual power amplifier distortion derived from the carrier cancellation combiner 330 of loop 3 and injects the error signal to the amplifier's output signal path via directional coupler 371.

The directional coupler 666 at the output of the composite ACT/Feedforward amplifier couples a portion of the distortion signal to an input port 105 of a further pilot tone receiver 667, which drives a further pilot energy minimization mechanism 668 within DSP 100. This auxiliary pilot tone minimization mechanism 668 adjusts the parameters of the vector modulator 346 based upon detected pilot tone distortion energy, to produce auxiliary distortion signal products that are equal in amplitude and opposite in phase from the original amplifier distortion of ACT main RF amplifier stage 200. These distortion products provide further cancellation of any remaining distortion generated by the main RF amplifier stage 200 when the feed forward error path is reinjected into the output of the output combiner 90 at directional coupler 371.

Directional coupler 371 is installed between a delay line 373 in the output path of the output combiner 90 and the output directional coupler 95. Similar to the use of delay line 336, the delay imparted by the delay line 373 equals the signal propagation delay through in error amplifier path and serves to ensure there is adequate phase matching at the feed forward directional coupler 371 over the operating frequency range. The output of directional coupler 371 corresponds to a recombination of the amplified feed-forward signal anti-phase with a delayed version of the output signal from the main path amplifier stage 200, and achieves very high distortion suppression so that the linearity of the amplifier is significantly enhanced.

Directional coupler 353 samples distortion and residual pilot energy due to imperfect adjustment of the ACT amplifier stage 200. Pilot energy at the output of direction coupler 353 is sensed by pilot receiver 114 and used to control ACT vector modulator 50 via a power minimization loop 110 to minimize distortion at the output of the ACT amplifier stage 200.

In the embodiment of FIG. 2, the output direction coupler 95 samples desired carrier, pilot and distortion energy at the output of the ACT power amplifier. In FIG. 3, the directional coupler 353 samples the same energy, with the carrier power substantially eliminated by the carrier cancellation process of loop 3 of the feedforward process. As a result, the pilot signal to carrier ratio at the coupled port of directional coupler 353 is enhanced over that of the coupled port of the directional coupler 95 of the embodiment of FIG. 2.

For this reason, the pilot energy at the coupled port of directional coupler 353 is used to control the ACT vector modulator 50 via the pilot receiver 114 and energy minimization mechanism 110.

Thus, the power minimization and performance monitor controllers and associated pilot generator and pilot receiver circuits of the ACT RF amplifier linearization stage 200 maintain distortion cancellation in the pre-distortion loop, while the feed forward loop of the feed-forward stage 300 results in a simplification in circuit implementation that reduces amplifier size, complexity and cost.

As will be appreciated from the foregoing description, the potential amplifier output signal and distortion energy inequality problem of an open loop ACT-based RF power amplifier linearization architecture is substantially minimized, by injecting a pilot tone as a 'pseudo distortion' signal and using a set of power minimization loops that are closed around the RF amplifier pair. The power minimizing control loops control a set of vector modulators such that both the injected pilot tone and intermodulation distortion products are canceled, while RF carrier components constructively sum in the composite output of the amplifiers. Both signal summation adjustment and distortion cancellation adjustment may be independently maintained to provide more than 20 dB of distortion reduction over a wide range of supply voltage, temperature and different input signal characteristics.

In addition, by wrapping a feed forward loop around this closed loop pre-distortion architecture, the amplitude of the distortion products may be decreased by up to another 35 dB. The addition of the feed-forward loop permits an overall signal-to-distortion ratio as high as 85 dBc to be achieved. Because the closed loop ACT pre-distortion architecture is more efficient than a equivalent single loop feed forward power amplifier, the overall system is several percent more efficient than a dual loop feed forward design with similar performance.

While we have shown and described a number embodiments in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed is:

1. An RF power amplifier apparatus comprising:
an RF input port to which an RF input signal is applied;
an RF output port from which an amplified RF output signal is derived;
first and second RF signal processing paths coupled between said input and output ports and containing first and second RF power amplifiers;
said first RF signal processing path including a first RF signal vector modulator, that is adapted to controllably adjust a first RF signal component of said RF input signal applied to said first RF power amplifier;
said second RF signal processing path including an intermodulation distortion (IMD) extraction circuit coupled to an output of said first RF power amplifier and to said RF input port, and including a second RF signal vector modulator adapted to controllably adjust said RF input signal, and a third RF signal vector modulator adapted to controllably adjust an IMD component present in an amplified RF output signal from said first RF power amplifier, and to generate a second RF signal component as a combination of a controllably adjusted RF input signal and said controllably adjusted IMD component;
an output signal combiner coupled to outputs of said first and second RF power amplifiers and to said output port, and being operative to produce said RF output signal as a composite of said first and second RF signal components, in which RF carrier components produced by said first and second RF power amplifiers constructively sum and IMD components produced thereby destructively combine; and
a vector modulator controller, which is adapted to control said first, second and third vector modulators independently of one another.

2. The RF power amplifier apparatus according to claim 1, wherein said first and second RF power amplifiers are matched RF power amplifiers.

3. The RF power amplifier apparatus according to claim 1, wherein said vector modulator controller is adapted to control one of said vector modulators based upon power minimization at a signal port of said output signal combiner.

4. The RF power amplifier apparatus according to claim 3, wherein said vector modulator controller is adapted to control said first vector modulator based upon power minimization of carrier energy leakage in said output signal combiner.

5. The RF power amplifier apparatus according to claim 1, wherein said IMD extraction circuit includes a cancellation combiner that is operative to differentially combine a sample of the amplified RF output signal produced by said first RF power amplifier with a portion of said RF input signal to derive said IMD component, and to combine said IMD component with said RF input signal applied to said second signal processing path, to produce said second RF signal component as a combination of said RF input signal and said IMD component, where said IMD component is phase-inverted with respect to a carrier component at the output of the first RF power amplifier.

6. The RF power amplifier apparatus according to claim 5, wherein said vector modulator controller is adapted to control said third vector modulator based upon power minimization of monitored distortion energy at the output of said carrier cancellation combiner.

7. The RF power amplifier apparatus according to claim 1, further including a pilot tone generator, which is operative to inject a first pilot tone into the signal path through said first RF power amplifier, and a second pilot tone into the signal path through said second RF power amplifier, and wherein said vector modulator controller includes a pilot tone receiver coupled to said output port of said output signal combiner, and being adapted to control said third vector modulator based upon pilot tone energy in said output port of said output signal combiner.

8. The RF power amplifier apparatus according to claim 7, wherein said vector modulator controller is adapted to control said second vector modulator based upon pilot tone energy in the composite output of said output signal combiner.

9. The RF power amplifier apparatus according to claim 8, wherein said second pilot tone has the same frequency as, but complementary phase with respect to, said first pilot tone.

10. The RF power amplifier apparatus according to claim 1, further including a feed-forward RF amplifier loop coupled to said first RF signal processing path and said output port, and being operative to provide an amplified RF distortion output signal containing distortion introduced by said first and second RF amplifiers, but effectively excluding said RF input signal, and wherein said output signal combiner is coupled to said feed-forward amplifier loop and is operative to combine said amplified RF distortion output signal with said RF output signal to produce a refined RF output signal.

11. The RF power amplifier apparatus according to claim 10, further including a fourth vector modulator coupled with said first RF signal processing path and being adapted to controllably adjust said first RF signal component of said RF input signal applied to said first RF power amplifier, and wherein said feed-forward RF amplifier loop includes a fifth vector modulator adapted to controllably adjust said amplified RF distortion output signal, and wherein said vector modulator controller is adapted to control said fourth and fifth vector modulators independently of one another and independently of said first, second and third vector modulators.

12. The RF power amplifier apparatus according to claim 11, wherein said vector modulator controller is adapted to control said fourth vector modulator based upon power minimization at a signal port of said signal combiner.

13. The RF power amplifier apparatus according to claim 12, wherein said vector modulator controller is adapted to control said fifth vector modulator based upon pilot tone energy in the composite output of said output signal combiner.

14. An RF power amplifier apparatus comprising:
an RF input port;
an RF output port;
a first RF signal processing path coupled between said RF input and output ports and containing a first RF power amplifier, and a first RF signal vector modulator, that is adapted to controllably adjust a first RF signal component of an RF input signal coupled to said RF input port;
a second RF signal processing path coupled between said input and output ports and containing a second RF power amplifier, that is effectively matched with said first RF power amplifier, and an intermodulation distortion (IMD) extraction circuit coupled to an output of said first RF power amplifier and to said RF input port, said second RF signal processing path including a second RF signal vector modulator, that is adapted to controllably adjust said RF input signal, and a third RF signal vector modulator, that is adapted to controllably adjust said IMD component, and to generate a second RF signal component as a combination of a controllably adjusted RF input signal and a controllably adjusted IMD component present in an amplified RF output signal from said first RF power amplifier;

an output signal combiner coupled to outputs of said first and second RF power amplifiers and to said output port, and being adapted to produce said RF output signal as a composite of said first and second RF signal components, in which RF carrier components produced by said first and second RF power amplifiers constructively sum and IMD components destructively combine;

a pilot tone generator, which is operative to inject a first pilot tone into the signal path through said first RF power amplifier and a second pilot tone into the signal path through said second RF power amplifier; and a vector modulator controller, which is adapted to control said first vector modulator based upon power minimization of carrier energy in a carrier cancellation path of said intermodulation distortion (IMD) extraction circuit, said second vector modulator based upon leakage energy in a terminated output port of said output signal combiner, and said third vector modulator based upon power minimization of monitored pilot tone energy at the output of said carrier cancellation combiner.

15. The RF power amplifier apparatus according to claim 14, wherein said first pilot tone has the same frequency as, but complementary phase with respect to, said second pilot tone.

16. The RF power amplifier apparatus according to claim 14, further including a feed-forward RF amplifier loop coupled to said first RF signal processing path and said output port, and being operative to provide an amplified RF distortion output signal containing distortion introduced by said first and second RF amplifiers, but effectively excluding said RF input signal, and wherein said output signal combiner is coupled to said feed-forward amplifier loop and is operative to combine said amplified RF distortion output signal with said RF output signal to produce a refined RF output signal.

17. The RF power amplifier apparatus according to claim 16, further including a fourth vector modulator coupled with said first RF signal processing path and being adapted to controllably adjust said first RF signal component of said RF input signal applied to said first RF power amplifier, and wherein said feed-forward RF amplifier loop includes a fifth vector modulator adapted to controllably adjust said amplified RF distortion output signal, and wherein said vector modulator controller is adapted to control said fourth and fifth vector modulators independently of one another and independently of said first, second and third vector modulators.

18. The RF power amplifier apparatus according to claim 17, wherein said vector modulator controller is adapted to control said fourth vector modulator based upon power minimization of a signal port of said output signal combiner, and said fifth vector modulator based upon pilot tone energy in the composite output of said output signal combiner.

19. A method of amplifying an RF signal comprising the steps of:

(a) applying said RF signal to a first RF signal processing path containing a first RF power amplifier;

(b) controllably adjusting said RF signal applied to said first RF power amplifier;

(c) combining said RF signal and a first amplified RF output signal from said first RF signal amplifier in a carrier cancellation path to produce a distortion signal containing distortion in said first amplified RF output signal;

(d) controllably adjusting said distortion signal to produce an adjusted distortion signal;

(e) controllably adjusting said RF signal to produce a further adjusted RF signal;

(f) combining said adjusted distortion signal with said further adjusted RF signal to produce a distorted RF signal;

(g) coupling said distorted RF signal to a second signal processing path containing a second RF power amplifier, that is effectively matched with said first RF power amplifier;

(h) combining said first amplified RF output signal from said first RF power amplifier with a second amplified RF output signal from said second RF power amplifier to produce at an output port an RF output signal in which RF carrier components produced by said first and second RF power amplifiers constructively sum and distortion components destructively combine; and (i) injecting a first pilot tone into said first signal path through said first RF power amplifier and a second pilot tone into said second signal path through said second RF power amplifier; and wherein step (b) comprises controllably adjusting said RF signal applied to said first RF power amplifier based upon power minimization of carrier energy in said carrier cancellation path, step (d) comprises controllably adjusting said distortion signal based upon power minimization of monitored pilot tone energy in said RF output signal produced in step (h), and step (e) comprises controllably adjusting said RF signal to produce said further adjusted RF signal based upon leakage energy produced in step (h).

20. The method according to claim 19, further including the step (j) of coupling a feed-forward RF amplifier loop coupled to said first RF signal processing path and said output port, and being operative to provide an amplified RF distortion output signal containing distortion introduced by said first and second RF amplifiers, but effectively excluding said RF signal, and wherein said step (h) further includes combining said amplified RF distortion output signal with said RF output signal to produce a refined RF output signal.

* * * * *